US008880778B2

(12) United States Patent
Pasquale et al.

(10) Patent No.: US 8,880,778 B2
(45) Date of Patent: Nov. 4, 2014

(54) MEMORY BUFFER HAVING ACCESSIBLE INFORMATION AFTER A PROGRAM-FAIL

(75) Inventors: Cimmino Pasquale, Somma Vesuviana (IT); Falanga Francesco, Pozzuoli (IT); Massimo Iaculo, San Marco Evangelista (IT); Minopoli Dionisio, Arzano (IT); Marco Ferrara, Nocera Inferiore (IT); Campardo Giovanni, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 12/779,671

(22) Filed: May 13, 2010

(65) Prior Publication Data

US 2011/0283050 A1 Nov. 17, 2011

(51) Int. Cl.
*G06F 12/02* (2006.01)

(52) U.S. Cl.
CPC .... *G06F 12/0246* (2013.01); *G06F 2212/7203* (2013.01); *G06F 2212/1032* (2013.01)
USPC .................................. 711/103; 711/E12.008

(58) Field of Classification Search
CPC .................................................. G06F 12/0246
USPC .......... 711/103, 115, 159, E12.001, E12.008; 714/42, 6.24
See application file for complete search history.

(56) References Cited

U.S. PATENT DOCUMENTS

| | | | |
|---|---|---|---|
| 6,788,609 B2 | 9/2004 | Yamagami et al. | |
| 7,401,267 B2 * | 7/2008 | Keays | 714/52 |
| 7,873,778 B2 * | 1/2011 | Choi et al. | 711/103 |
| 8,132,045 B2 * | 3/2012 | Avila et al. | 714/6.21 |
| 8,151,144 B2 * | 4/2012 | Tsai | 714/42 |
| 8,422,292 B2 * | 4/2013 | Choi et al. | 365/185.03 |
| 8,683,270 B2 * | 3/2014 | Bueb et al. | 714/42 |
| 2004/0042269 A1 * | 3/2004 | Tamura et al. | 365/185.12 |
| 2008/0209266 A1 * | 8/2008 | Lee et al. | 714/16 |
| 2009/0040836 A1 | 2/2009 | Lee | |
| 2009/0122610 A1 * | 5/2009 | Danon et al. | 365/185.08 |
| 2009/0138783 A1 | 5/2009 | Aoki | |
| 2009/0244983 A1 * | 10/2009 | Park | 365/185.23 |

FOREIGN PATENT DOCUMENTS

| | | |
|---|---|---|
| CN | 1487530 A | 4/2004 |
| JP | 2007-310680 | 11/2007 |
| JP | 2008-500678 | 1/2008 |
| JP | 2008-524748 | 7/2008 |
| JP | 2008-181497 | 8/2008 |
| JP | 2009-129284 | 6/2009 |
| TW | 460793 | 10/2001 |

(Continued)

OTHER PUBLICATIONS

English Translation of Notice of Rejection Ground mailed on Feb. 19, 2013 for Japanese Patent Application No. 2011096432.

(Continued)

*Primary Examiner* — Pierre-Michel Bataille
(74) *Attorney, Agent, or Firm* — Knobbe, Martens, Olson & Bear LLP

(57) ABSTRACT

A memory device, and a method of operating same, utilize a first memory buffer associated with a first memory array and a second memory buffer associated with a second memory array to maintain information subsequent to a program-fail event associated with the first memory array and to provide the information to the second memory array.

19 Claims, 4 Drawing Sheets

(56) References Cited

FOREIGN PATENT DOCUMENTS

| TW | 586116 | 5/2004 |
| TW | 200603100 A | 1/2006 |
| WO | WO 2005/119693 | 12/2005 |
| WO | WO 2010/024506 | 3/2010 |
| WO | WO 2010024506 A1 * | 3/2010 |

OTHER PUBLICATIONS

English Translation of Notice of Preliminary Rejection mailed on Feb. 27, 2013 for Korean Patent Application No. 10-2011-44653.

English Translation of Office Action dated May 14, 2013 for German Patent Application No. 102011075814.3.

English Translation of Office Action dated Apr. 16, 2013 for Chinese Patent Application No. 201110126802.3.

English Translation of Decision of Rejection mailed on Dec. 3, 2013 for Japanese Patent Application No. 2011-096432.

English Translation of Third Office Action issued on Mar. 3, 2014 for Chinese Application No. 201110126802.3 .

English Translation of Office Action issued on Mar. 20, 2014 for Taiwan Patent Application No. 100116940.

English Translation of Pre-Appeal Reexamination Report for Japanese Application No. 2011-096432 dated May 28, 2014 in 4 pages.

\* cited by examiner

MEMORY BUFFER HAVING ACCESSIBLE INFORMATION AFTER A PROGRAM-FAIL

BACKGROUND

1. Field

Subject matter disclosed herein relates to a memory device, and a method of operating same.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Occasionally during operation of a memory device, a process of writing and/or reading information to/from a memory array may fail. Such a failure need not necessarily lead to a fatal operational error if a memory device includes safeguards such as error correction and/or an ability to re-initiate a read and/or write process, for example. Having such safeguards, however, may result in extra costs such as a use of a memory device area that could otherwise be used for other purposes and/or adding steps to a process to fabricate the memory device, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
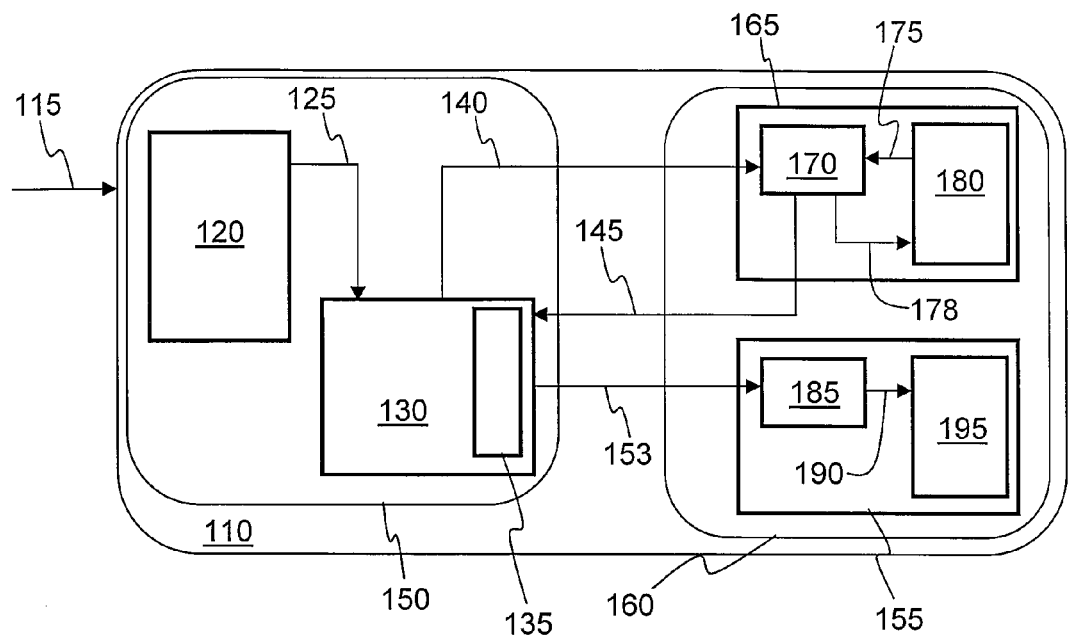
FIG. 1 is a schematic block diagram of a memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device may comprise a memory controller to initiate a program operation to write particular information to a memory array. Such a memory device may also comprise a memory buffer to receive the particular information from the memory controller, to store the particular information during the program operation, and to store the particular information subsequent to a program-fail event. Such a program-fail event may result from any of a number of situations, such as defects of one or more memory cells, memory blocks, or other portion of a memory array, for example. Such defects may arise from a fabrication process or may result from physical changes subsequent to the fabrication of a memory device. For example, one or more defective memory cells in a memory block may result in the entire memory block being defective. Such a bad memory block may lead to a failure to read from or write to the bad memory block. Accordingly, a memory buffer that maintains particular information subsequent to such a write failure may have such particular information available to a subsequent re-write process. Of course, such reasons for program-fail events are merely examples, and claimed subject matter is not so limited.

In other words, such a memory buffer may maintain stored information after such information failed to be successfully written from the memory buffer to a memory array. In a particular implementation, for example, such a memory buffer may comprise a NAND page buffer, though other particular memory types may be used in other implementations. As a result of maintaining information or data during a program-fail event, a data page, for example, may still be available to a NAND user (e.g., a memory card controller) after a failure to program such a data page into a block of a NAND memory array. Accordingly, such a data page, still present in a NAND page buffer, may be accessible for reading, modifying, and/or re-programming into another block of memory array.

In an embodiment, information being programmed may be present in a NAND page buffer during a program-busy portion of a write operation. Such information may be additionally available for further reading and/or modifying or rewriting using a read-from-buffer command and/or a write-from-buffer command if a program-fail event affects page programming, due, for example, to a bad memory block. An embodiment of such a memory device as described above, for example, may provide a number of benefits including a memory architecture that avoids using memory die area for an additional controller RAM buffer to maintain information in case such information fails to be successfully programmed in a memory array. In an implementation, a NAND page buffer may be used as additional volatile memory in a particular operation, for example, that need not use non-volatile data storage. Of course, such benefits of embodiments described herein are merely examples, and claimed subject matter is not so limited.

Embodiments, such as those described above, may allow implementation of a relatively robust bad-block management that hides internal bad memory blocks from an external host. Such bad-block management may operate using spare memory blocks or other memory portions to substitute for bad blocks. In one implementation, a process of hiding bad memory blocks may mean that no error information would be returned to a host other than, for example, an "operation complete" message after related operations are completed. For example, a memory device may receive a write and/or erase command from a host. If such a write and/or erase operation leads to an internal bad block generation, then a memory controller of the memory device may manage internally remap/recopy processes in order to carry out the write and/or erase operation. Such management may be transparent to the host, which may merely receive an indication that a write and/or erase operation is completed. In one implementation, such management may involve holding a pending programming page in an extra controller random access memory (RAM) in order to repeat a new page program onto another "fresh" block if a fail of a first block occurs. However, such extra RAM may occupy valuable area on a memory die that may otherwise be used for another purpose. For example, extra controller RAM may use about a square millimeter for 0.11 micron technology. In another implementation, such management may involve an error correcting code (ECC) engine and a process to read back (for recopy) a just-failed page directly from a NAND block, instead of holding original information into an extra RAM buffer. Success of such an implementation may rely on an ease with which damage that occurred during a programming phase may be corrected using ECC. However, it may be more likely that such damage that occurred after a page program fail is not correctable by ECC due to performance limitations of the ECC. Of course, such an implementation of an ECC is merely an example, and claimed subject matter is not so limited.

Figure 2:
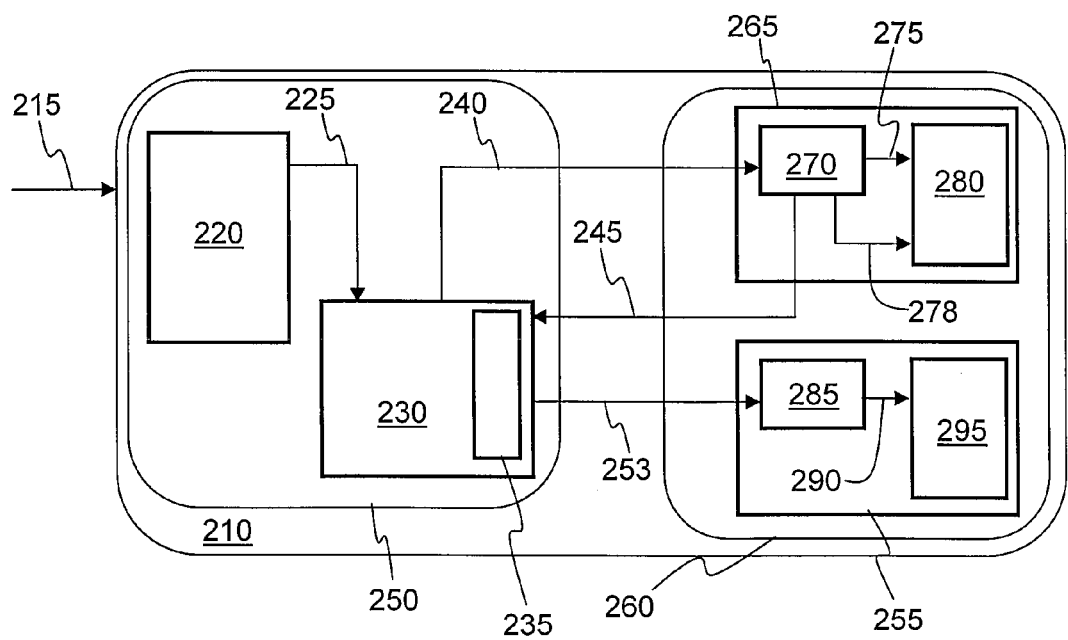
FIG. 2 is a schematic block diagram of a memory device, according to another embodiment.
Figure 3:
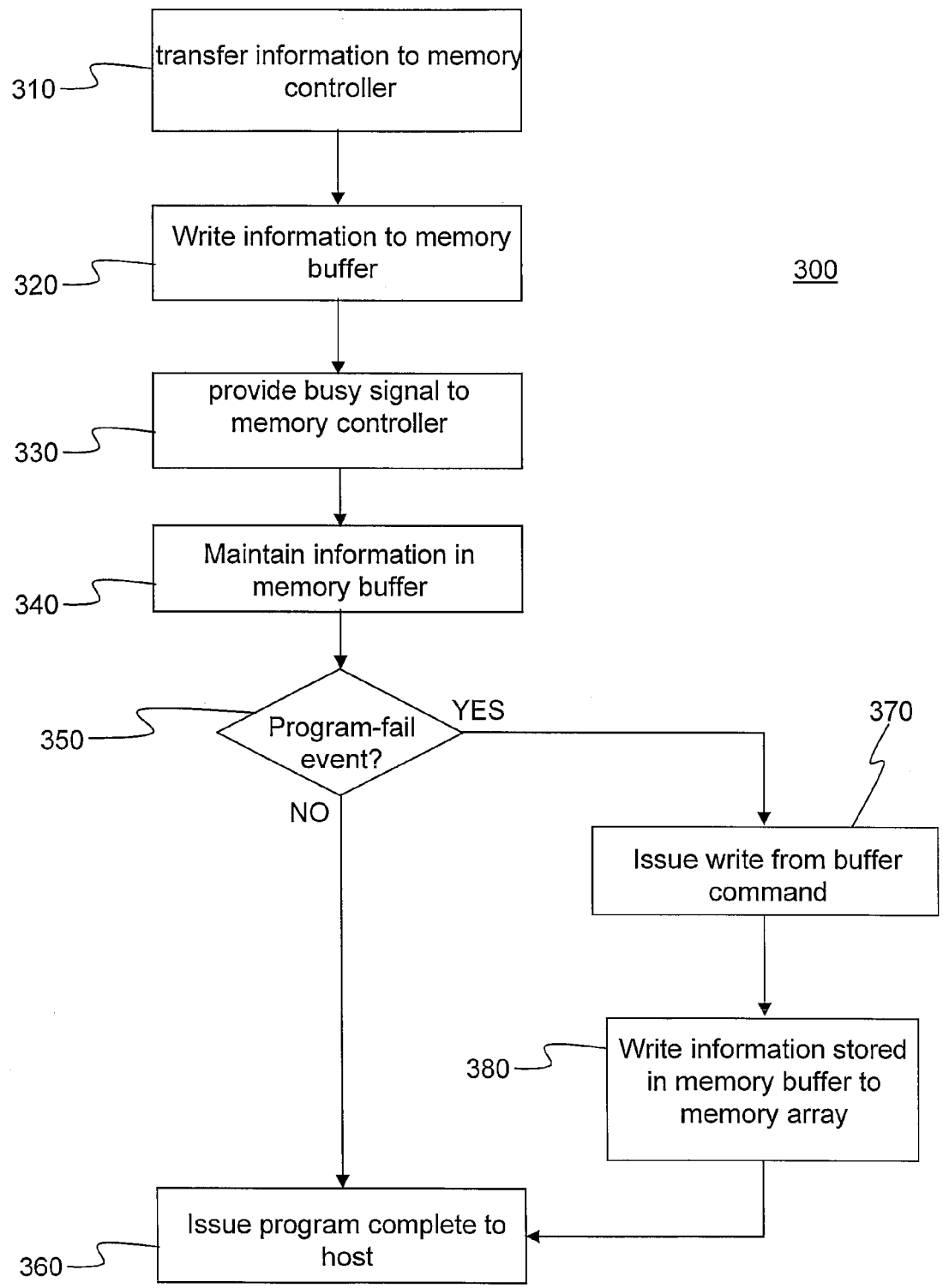
FIG. 3 is a flow diagram of a process to program a memory device, according to an embodiment.

FIG. 1 is a schematic block diagram of a memory device 110, according to an embodiment. Such a memory device 110 may receive information and/or instructions 115 from an external host (not shown). Subsequent to a program-fail event, memory device 110 may be capable of repeating attempts to re-program information to nonvolatile memory, as described in detail below. However, such a capability may include a cost of having an additional controller RAM buffer to maintain information for such re-programming attempts, as also described below. Arrows in FIGS. 1-3 are single-ended to correspond to descriptions of particular embodiments and implementations that follow. However, any or all such arrows may be double-ended to indicated flow in either one or both directions, and claimed subject matter is not limited in this respect. For example, arrow 115 may represent information provided to memory device 110 and/or information provided by memory device 110 to an external entity.

In a particular implementation, memory device 110 may comprise a NAND flash memory card usable by a number of types of hosts to store information. For example memory device 110 may comprise a memory card used for a digital camera (the host), a "thumb drive", and so on. In an embodiment, memory device 110 may comprise a controller 150 and a memory portion 160. Further, controller 150 may comprise controller RAM buffer interface 120 and a processor 130 that may include an ECC engine 135. Memory portion 160 may comprise one or more memory partitions 155 and 165, for example. Such memory partitions may be on a same die or on separate die, and claimed subject matter is not so limited. Individual memory partition 155 may include internal RAM buffer 185 and memory array 195. Individual memory partition 165 may include internal RAM buffer 170 and memory array 180. Although not shown, memory portion 160 may include additional memory partitions. In one implementation, such an internal RAM buffer may comprise a NAND page buffer. For example, RAM buffer 185 and 170 may comprise a volatile memory to host a page of information to be programmed to memory array 195 and memory array 180, respectively. Memory array 195 and memory array 180 may comprise nonvolatile memory.

Referring to memory device 110, in response to a program-fail event (e.g., bad block occurrence) during a write operation, information previously written to a bad memory block may be copied to a new memory block. Information, in response to the program-fail event, may also be copied to the new memory block. In one implementation, memory device 110 may return to a host a write-operation-complete signal, thus hiding from the host the program-fail event. Such a write process is now explained in detail. A host (not shown) may provide information 115 to memory device 110 for writing to a nonvolatile portion of a memory array 180, for example. Such information 115 may be temporarily stored in controller RAM buffer interface 120 and subsequently transferred to processor 130 via line 125. Processor 130 may next transfer information 115 into RAM buffer 170 via line 140. Meanwhile, information 115 need not be maintained in controller RAM buffer interface 120. RAM buffer 170, via line 178, may transfer information 115 to memory array 180. If a program-fail event occurs during such a transfer of information to memory array 180, then a process to retry programming may proceed as follows. Information 115 that failed to be fully written into memory array 180 may be at least partially retrieved from the memory array and placed in RAM buffer 170 using a read operation via line 175, for example. Information 115 may be read from RAM buffer 170 via line 145 to be processed by ECC engine 135 to correct one or more errors resulting from the program-fail event. If ECC engine 135 successfully corrects such errors, information 115 may be copied to another memory array 195 via line 153, RAM buffer 185, and line 190, for example. Accordingly, such a process of retrying programming may rely on the success of ECC engine 135. Of course, such details of a write process are merely examples, and claimed subject matter is not so limited.

FIG. 2 is a schematic block diagram of a memory device 210, according to an embodiment. Similar to memory device 110 shown in FIG. 1, for example, memory device 210 may receive information and/or instructions 215 from an external host (not shown). In a particular implementation, memory device 210 may comprise a NAND flash memory card that may be usable by a number of types of hosts to store information. For example memory device 210 may comprise a memory card used for a digital camera (the host), a "thumb drive", and so on. As for memory device 110, memory device 210 may be capable of repeating attempts to re-program information to nonvolatile memory subsequent to a program-fail event. In contrast to memory device 110, however, such a capability of memory controller 210 may be provided by a RAM buffer located between a memory controller and a memory array to where such information is to be programmed, as also described below. For example, memory device 110 included a controller RAM buffer to maintain information for such re-programming attempts, whereas memory device 210 need not rely on such a controller RAM buffer for re-programming.

In an implementation, memory device 210, similar to memory device 110, may comprise a controller 250 and a memory portion 260. Further, controller 250 may comprise controller RAM buffer interface 220 and a processor 230 including an ECC engine 235. Memory portion 260 may comprise one or more memory partitions 255 and 265, for example. Such memory partitions may be on a same die or on separate die, and claimed subject matter is not so limited. Individual memory partition 255 may include internal RAM buffer 285 and memory array 295. Individual memory partition 265 may include internal RAM buffer 270 and memory array 280. Although not shown, memory portion 260 may include additional memory partitions. In one implementation, such an internal RAM buffer may comprise a NAND page buffer. For example, RAM buffer 285 and 270 may comprise a volatile memory to host a page of information to be programmed to memory array 295 and memory array 280, respectively. Memory array 295 and memory array 280 may comprise nonvolatile memory.

Referring to memory device 210, in response to a program-fail event (e.g., bad block occurrence) during a write operation, information previously written to a bad memory block may be copied to a new memory block. Current information, in response to the program-fail event, may also be copied to the new memory block. In one implementation, memory device 210 may return to a host a write-operation-complete signal, thus hiding from the host the program-fail event. Such a write process is now explained in detail. A host (not shown) may provide information 215 to memory device 210 for writing to a memory array 280, for example. Such information 215 may be temporarily stored in controller RAM buffer interface 220 and subsequently transferred to processor 230 via line 225. Processor 230 may next transfer information 215 into RAM buffer 270 via line 240. In one implementation, similar to memory device 110, controller RAM buffer interface 220 may be cleared of information 215 subsequent to transfer of information 215 to RAM buffer 270. RAM buffer 270, via line 278, may transfer information 215 to memory array 280. If a program-fail event occurs during such a transfer of information to memory array 280, then a process to retry programming may proceed as follows. Information 215 that failed to be written into memory array 280 may still be maintained in RAM buffer 270. Accordingly, such maintained information may be available for another program operation to another portion of memory in memory array 280 via line 275, for example. Such an additional program operation using information maintained in RAM buffer 270 may occur in response to a write-from-buffer command initiated by processor 230.

In another embodiment, after a program-fail event, information maintained in RAM buffer 270 may be available for another program operation to another memory array 295. Such an additional program operation using information maintained in RAM buffer 270 may occur in response to a read-from-buffer command initiated by processor 230. In detail, information 215 that failed to be written into memory array 280 may be retrieved from RAM buffer 270 after such a failure of a program operation using the read-from-buffer command operation. In one implementation, information 215 may be read from RAM buffer 270 via line 245. Information 215 may be written to another memory array 295 via line 253, RAM buffer 285, and line 290, for example. In another implementation, information 215 may be read from RAM buffer 270 via line 245 to processor 230, which may determine another memory location to where information 215 is to be written during a re-program process. For example, such a memory location may comprise memory array 295, which may be located on a same or different die as that of memory array 280 where the program-fail occurred.

FIG. 3 is a flow diagram of a process 300 to program a memory device, according to an embodiment. At block 310, a host of a memory device, such as camera, a cell phone, or other electronic device having information to store, may provide such information to a memory controller of the memory device. At block 320, such information may be written to a memory buffer. In one implementation, a memory buffer may comprise a RAM page buffer, for example. At block 330, during a program operation that writes information from the memory buffer to a memory array, the memory buffer may provide a signal to the memory controller to indicate that the memory buffer is busy. At block 340, information stored in the memory buffer during the program operation that writes information to the memory array may be maintained subsequent to the program operation. Such a program operation may either succeed or fail, and a determination of either possibility may be performed at block 350. In one implementation, such a determination of whether a program-fail event has occurred may be performed by the memory controller subsequent to de-assertion of a NAND program busy signal. At this time, the memory controller may check a NAND status register containing a result (e.g., success or failure) of the operation. At block 360, in the case of a successful program operation, the memory device may provide a signal to the host of the memory device indicating that the program operation was successful and/or is complete. Otherwise, at block 370, in the case of a program-fail event, a memory controller may issue a write-from-buffer command to the memory buffer. Accordingly, at block 380, subsequent to a failed program operation, information maintained by a memory buffer may be written to a memory array. Such a memory array may comprise the same memory array as that involved with the earlier failed program operation. Optionally, information maintained by a memory buffer may be written to a different memory array. If the memory array is the same as that involved with the failed program operation, then a different portion of the memory array may be used in the process of block 380. For example, such a different portion of the memory array may comprise a different block of the memory array. In one implementation, the memory controller of the memory device may determine such memory locations to write information during a re-program process. As mentioned above, information may be written to a memory location of a memory array located on a die that is different from that of the memory array involved in the program-fail event. Finally, process 300 may proceed to block 360, where the memory device may provide a signal to the host of the memory device indicating that the program operation was successful and/or is complete. In such a case, the occurrence of a program-fail event may be hidden from the host, as discussed above.

Figure 4:
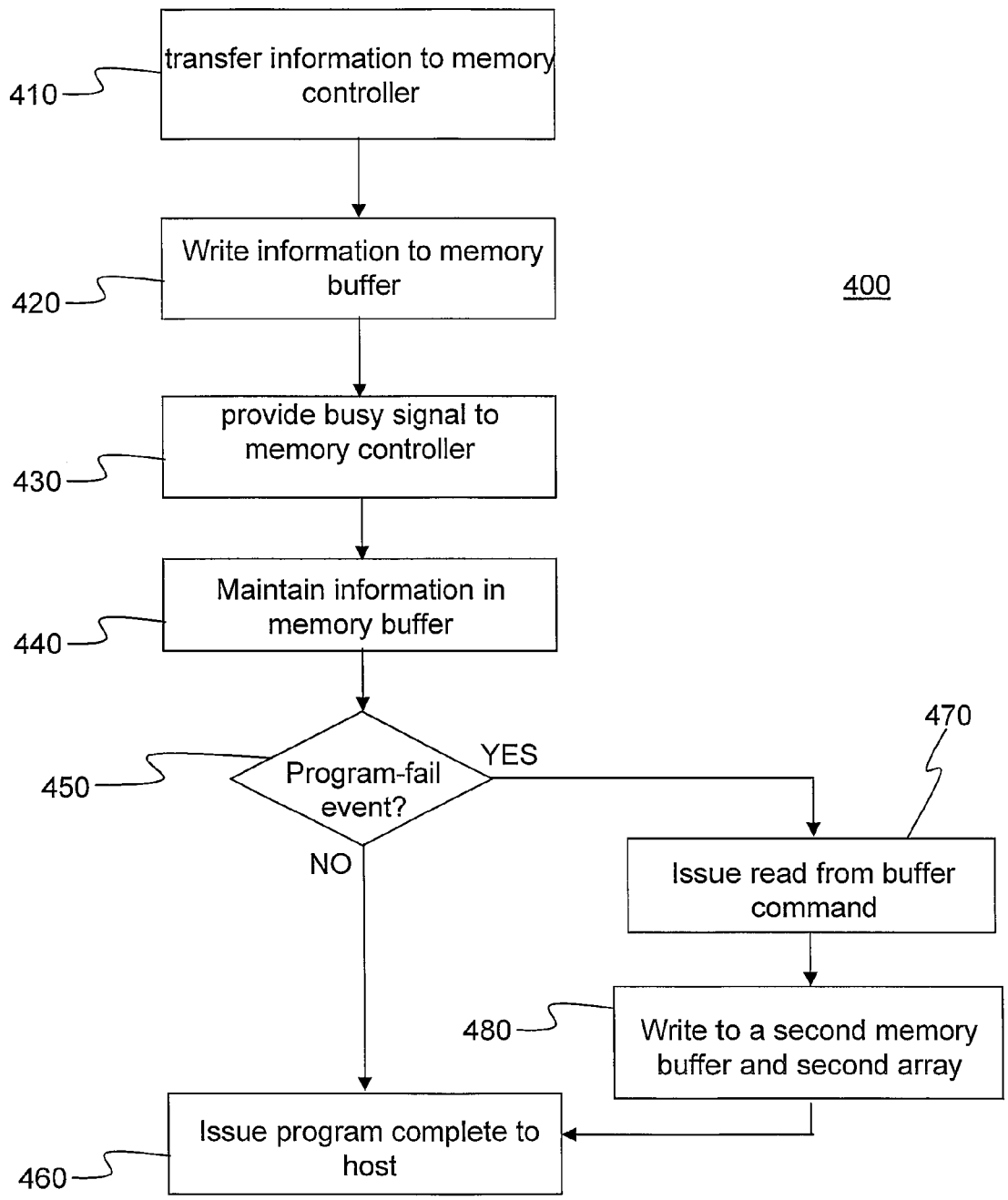
FIG. 4 is a flow diagram of a process to program a memory device, according to another embodiment.

FIG. 4 is a flow diagram of a process 400 to program a memory device, according to an embodiment. At block 410, a host of a memory device having information to store may provide such information to a memory controller of the memory device. At block 420, the information may be written to a memory buffer. In one implementation, such a memory buffer may comprise a RAM page buffer, for example. At block 430, during a program operation to write information from the memory buffer to a memory array, the memory buffer may provide a signal to the memory controller indicating that the memory buffer is busy. At block 440, information may be stored in a memory buffer during a program operation to write such information to a memory array. Additionally, such information may be maintained in a memory buffer subsequent to a program operation. Such a program operation may either be successful or fail, and a determination of either event may be performed at block 450. At block 460, in the case of a successful program operation, a memory device may provide a signal to the host of the memory device to indicate that the program operation was successful and/or is complete. Otherwise, at block 470, in the case of a program-fail event, the memory controller may issue a read-from-buffer command to the memory buffer. Accordingly, information maintained by the memory buffer subsequent to the attempted and failed program operation may be read from the memory buffer. In one implementation, however, such read information may be provided to the memory controller that may determine a portion of memory, other than the portion of memory involved in the program-fail event, in which to store the information retrieved from the memory buffer. Similarly, at block 480, information read from the memory buffer may be written to a portion of memory that has not previously led to a program-fail event. For example, such a portion of memory may comprise a block and/or a page of memory that is different from a block and/or a page of memory that led to a previous program-fail event. As mentioned above, information may be written to a memory location of a memory array located on a die that is different than that of the memory array involved in the program-fail event. Finally, process 400 may proceed to block 460, where the memory device may provide a signal to the host of the memory device indicating that the program operation was successful and/or is complete. In such a case, the occurrence of a program-fail event may be hidden from the host, as discussed above.

Figure 5:
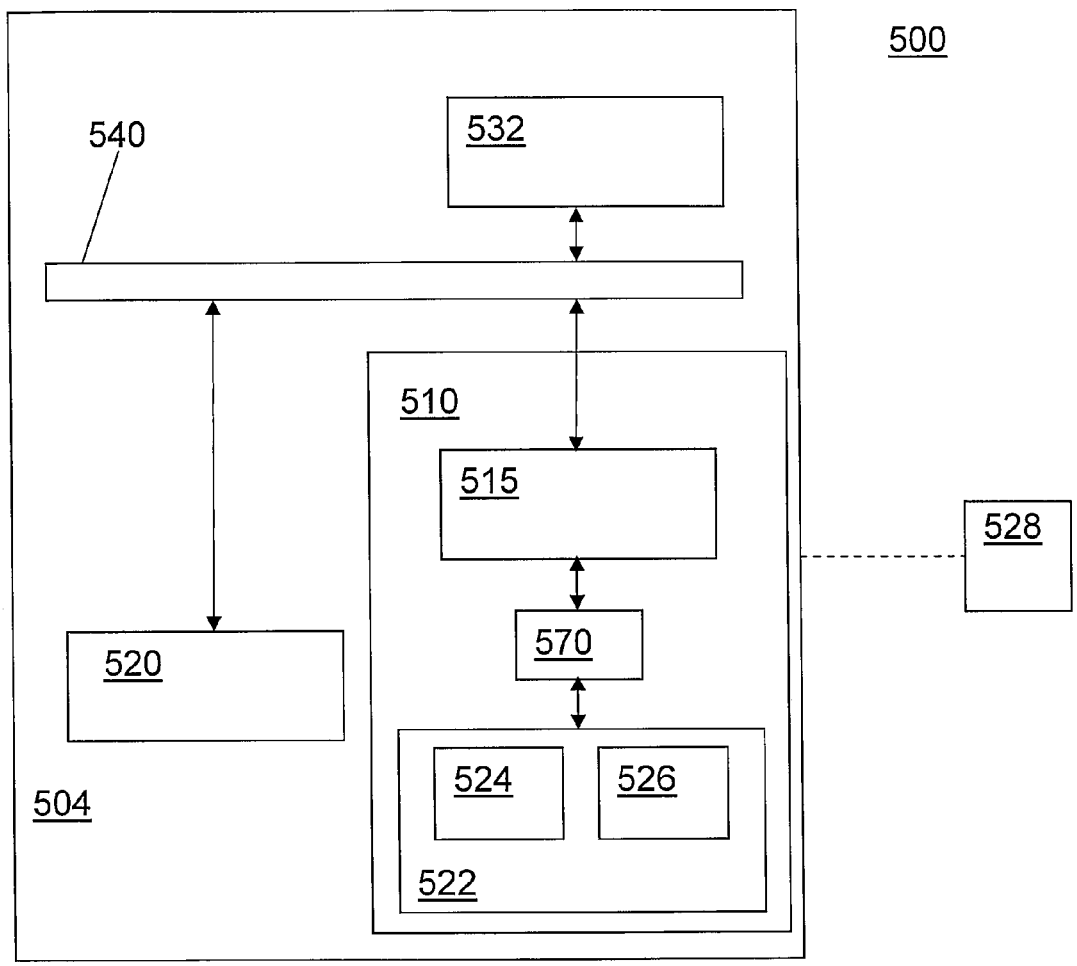
FIG. 5 is a schematic block diagram of a computing system and a memory device, according to an embodiment.

FIG. 5 is a schematic view of a computing system 500 and a memory device, according to an embodiment. Such a computing device may comprise one or more processors, for example, to execute an application and/or other code. For example, memory device 510 may comprise a memory array 280 shown in FIG. 2. A computing device 504 may be representative of any device, appliance, or machine that may be configurable to manage memory device 510. Memory device 510 may include a memory controller 515 and a memory 522. In one implementation, such a memory device may comprise memory device 210, controller 250, and memory 280 shown in FIG. 2, for example. By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515. Processing unit 520 is representative of one or more circuits configurable to perform at least a portion of a data computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may include an operating system configured to communicate with memory controller 515. Such an operating system may, for example, generate commands to be sent to memory controller 515 over bus 540. Such commands may comprise read and/or write commands. In response to a write command, for example, memory controller 515 may provide a bias signal, such as a set or reset pulse to write information associated with the write command to a memory partition, for example.

Memory 522 is representative of any data storage mechanism. Memory 522 may receive information to be stored via RAM buffer 570, which may be similar to RAM buffer 270 shown in FIG. 2, for example. Memory 522 may include, for example, a primary memory 524 and/or a secondary memory 526, each of which may be partitioned into one or more partitions as discussed above, for example. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory and/or one or more data storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry and/or make accessible data, code, and/or instructions for one or more of the devices in system 500.

In one embodiment, system 500 may comprise a memory device, such as memory device 200 shown in FIG. 2, for example. Such a memory device may comprise a memory controller 515 to initiate a program operation to write particular information to a memory array. The memory device may also comprise a memory buffer 570 to receive the particular information from the memory controller, to store the particular information during the program operation, and to store the particular information subsequent to a program-fail event. System 500 may further comprise a processor 520 to host one or more applications and to initiate write commands to the memory controller to provide access to said memory array. In one implementation, the memory buffer may comprise a NAND page buffer internal to a NAND memory comprising the memory array.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    initiating a program operation to write particular information to a first memory array via a first memory buffer;
    maintaining said particular information in said first memory buffer subsequent to a program-fail event; and
    subsequent to said program-fail event, writing said particular information to a second memory buffer associated with a second memory array.

2. The method of claim 1, further comprising:
    determining said program-fail event during said program operation;
    retrieving said particular information from said first memory buffer; and
    writing said particular information to the second memory array via the second memory buffer.

3. The method of claim 1, wherein said first memory buffer comprises a NAND page buffer.

4. The method of claim 1, wherein a memory device comprises a first memory partition and a second memory partition, said first memory partition comprising said first memory array and said first memory buffer, and said second memory partition comprising said second memory array and said second memory buffer, wherein said memory device comprises a NAND-based memory card to receive said particular information from a memory card controller.

5. The method of claim 1, further comprising, subsequent to said program-fail event, instructing said first memory buffer to write said particular information from said first memory buffer to said first memory array.

6. The method of claim 1, further comprising, subsequent to said program-fail event, reading said particular information stored in said first memory buffer.

7. A memory device comprising:
   a memory controller to initiate a program operation to write particular information to a memory array;
   a first memory buffer associated with a first portion of said memory array; and
   a second memory buffer associated with a second portion of said memory array, wherein said first memory buffer is configured to receive said particular information from said memory controller, to store said particular information during said program operation, and to store said particular information subsequent to a program-fail event associated with the first portion of said memory array, wherein the first portion of said memory array receives said particular information from said memory controller via said first memory buffer and, subsequent to said program-fail event, the particular information is written to the second memory bufer and the second portion of said memory array receives said particular information via said second memory buffer.

8. The memory device of claim 7, wherein said first memory buffer comprises a NAND page buffer.

9. The memory device of claim 7, wherein said first memory buffer and the first portion of said memory array are disposed on a same die.

10. The memory device of claim 7, wherein said memory device comprises a NAND-based memory card to receive said particular information from a memory card controller.

11. The memory device of claim 7, wherein said memory controller, in response to said program-fail event, is further configured to instruct said first memory buffer to write said particular information from said first memory buffer to the first portion of said memory array.

12. The memory device of claim 7, wherein said memory controller, in response to said program-fail event, is further capable of reading said particular information stored in said first memory buffer.

13. The memory device of claim 12, wherein said memory controller, subsequent to said reading, is further capable of providing said particular information to said second memory buffer associated with the second portion of said memory array.

14. A system comprising:
   a memory device comprising:
      a memory controller to initiate a program operation to write particular information to a memory array;
      a first memory buffer associated with a first portion of said memory array;
      a second memory buffer associated with a second portion of said memory array, wherein said first memory buffer is configured to receive said particular information from said memory controller, to store said particular information during said program operation, and to store said particular information subsequent to a program-fail event associated with the first portion of said memory array, wherein the first portion of said memory array receives said particular information from said memory controller via said first memory buffer and subsequent to said program-fail event, the particular information is written to the second memory buffer and the second portion of said memory array receives said particular information via said second memory buffer; and
   a processor to host one or more applications and to initiate write commands to said memory controller to provide access to said memory array.

15. The system of claim 14, wherein said first memory buffer comprises a NAND page buffer internal to a NAND memory comprising said memory array.

16. The system of claim 14, wherein said first memory buffer comprises a volatile memory.

17. The system of claim 14, wherein said memory device comprises a NAND-based memory card.

18. The system of claim 14, wherein said first memory buffer and the first portion of said memory array are disposed on a same die.

19. The system of claim 14, wherein said memory device comprises a NAND-based memory card to receive said particular information from a memory card controller.

* * * * *

UNITED STATES PATENT AND TRADEMARK OFFICE
CERTIFICATE OF CORRECTION

PATENT NO.       : 8,880,778 B2                     Page 1 of 1
APPLICATION NO.  : 12/779671
DATED            : November 4, 2014
INVENTOR(S)      : Cimmino Pasquale et al.

It is certified that error appears in the above-identified patent and that said Letters Patent is hereby corrected as shown below:

In the Claims
Column 9, line 27, in Claim 7, delete "bufer" and insert -- buffer --, therefor.

Signed and Sealed this
Third Day of March, 2015

Michelle K. Lee
*Deputy Director of the United States Patent and Trademark Office*